United States Patent [19]
Sugimoto et al.

[11] Patent Number: 5,841,187
[45] Date of Patent: Nov. 24, 1998

[54] MOLDED ELECTRONIC COMPONENT

[75] Inventors: Syuichi Sugimoto, Siga; Shinji Nakamura; Motonari Fujikawa, both of Kyoto; Yui Tada, Ibaragi, all of Japan

[73] Assignee: Omron Corporation, Kyoto, Japan

[21] Appl. No.: 827,156

[22] Filed: Mar. 27, 1997

Related U.S. Application Data

[63] Continuation of Ser. No. 493,174, Jun. 21, 1995, abandoned.

[30] Foreign Application Priority Data

Jun. 22, 1994 [JP] Japan ................................ 6-164767

[51] Int. Cl.$^6$ .................................................. H01L 23/495
[52] U.S. Cl. ........................... 257/666; 257/686; 257/667; 257/787; 257/798; 257/693
[58] Field of Search .................................. 256/666, 667, 256/676, 128, 690, 692, 693, 695, 696, 701, 734, 787, 788, 796; 257/787, 788, 790, 666, 709, 686, 701, 798

[56] References Cited

U.S. PATENT DOCUMENTS 5,097,317  3/1992  Fujimoto et al. ........................ 257/790
5,367,196  11/1994  Mahulikar et al. ...................... 257/709
5,536,970  7/1996  Higashi et al. .......................... 257/676

FOREIGN PATENT DOCUMENTS 2-292835  12/1990  Japan.

*Primary Examiner*—Carl W. Whitehead, Jr.
*Attorney, Agent, or Firm*—Morrison & Foerster LLP

[57] ABSTRACT

A method for manufacturing an electronic component by seal-molding with resin a die pad mounted by an electronic element thereon and loads of input-and-output terminals which are supported by a lead frame having an outer frame and removing such sealed electronic component with mold materials from the outer frame of the lead frame which includes suspending pins for supporting the leads and a first mold holder disconnected from the leads, the method including the steps of resin molding a first mold member on the leads and the first mold holder to join the leads and the first mold member with the first mold member, cutting the suspending pins between the first mold member and the outer frame, resin-molding a second mold member on the first mold member to cover the cut ends of the suspending pins, and cutting the first mold holder between the second mold member and the outer frame to remove thus molded electronic component from the lead frame.

3 Claims, 6 Drawing Sheets

MOLDED ELECTRONIC COMPONENT

This application is a continuation of U.S. application Ser. No. 08/493,174, filed Jun. 21, 1995, now abandoned.

BACKGROUND OF THE INVENTION

1. Field of the Invention

This invention relates to an electronic component and a method for manufacturing the same, and more particularly to an improved electronic component manufactured by mounting an electronic element such as a semiconductor chip or the like on a lead frame and molding the same with resin, effectively sealing the component.

2. Discussion of the Related Art

FIG. 6 shows an external perspective view of a conventional semiconductor package component 51, and FIG. 7 shows an internal view of the component. The component 51 is so constructed that a semiconductor chip 52 is die-bonded onto a die pad 55, wire-bonded to two pairs of input-and-output terminal leads 54 with gold wires 56, and molded with a plastic resin, effectively sealing the component. The conventional package 51 can be easily made be employing a lead frame 53 as shown in FIG. 8. The lead frame 53 is worked in a predetermined pattern to provide die pad 55 for mounting semiconductor chip 52 thereon, a pair of suspending pins 58 for supporting die pad 55 on an outer frame 53a of the lead frame from both sides thereof and input-and-output terminal leads 54 for connecting semiconductor chip 52 with an external circuit (not shown in the drawings).

In FIG. 8(a), semiconductor chip 52 is die bonded onto die pad 55, and is wire-bonded to input-and-output terminal leads 54 by gold wires 56. In FIG. 8(b), the semiconductor chip 52 is molded in a sealing manner by a plastic resin 57 (hidden portions unexposed to the surface are shown in solid lines. FIG. 8(c) also shows so). Finally four leads 54 and two suspending pins 58 are cut out from the lead frame 53 to provide a semiconductor package component 51 as shown in FIG. 8(c).

In thus manufactured semiconductor package component 51, however, cut ends 59 of suspending pins 58 connected with the die pad 55 are exposed to the external, whereby a surge current or static electricity is applied into semiconductor chip 52 mounted on die pad 55 through the cut ends 59 of suspending pins 58 to damage the chip or to produce electrification by touching the cut ends 59 of suspending pins 58 by his finger when the component 51 is connected with an external circuit.

To overcome such disadvantages, cut ends 59 may be covered by resin molding in a cast molding method on an external surface of component 51. This method, however, has the disadvantages that package components 51 cut off from lead frame 53 have to be worked on one by one, resulting in complicated manufacturing processes due to troublesome cast molding and lowered mass productivity. Furthermore, the resulting outer resin portion is inaccurate, and not satisfactory in view of pressure-resistance and sealing.

SUMMARY OF THE INVENTION

It is, therefore, a primary object of this invention to provide an improved easy method for manufacturing a safe and high performance electronic component to protect an electronic element which is molded with resin, effectively sealing the component.

According to a first aspect of this invention, there is provided a method for manufacturing an electronic component by seal-molding with resin a die pad mounted by an electronic element thereon and leads of input-and-output terminals, which are supported by an outer frame of a lead frame, and by removing such sealed electronic component with mold materials from the outer frame of the lead frame. The lead frame includes suspending pins for supporting the leads and a first mold holder disconnected from the leads. The method includes the steps of resin molding a first mold member on the leads and the first mold holder to join the leads and the first mold holder with the first mold member, cutting the suspending pins between the first mold member and the outer frame, resin-molding a second mold member on the first mold member to cover the cut ends of the suspending pins, cutting the first mold holder between the second mold member and the outer frame to remove thus molded electronic component from the lead frame. Since the first mold holder has only to be cut to remove the electronic component from the outer lead frame, the first mold holder can be cut off by punching when the component is removed from the outer frame and the construction of mold for the first and second molding can be simplified, whereby the production of the electronic components can be simplified.

According to a second aspect of this invention, there is provided a method for manufacturing an electronic component by seal-molding with resin a die pad mounting an electronic element thereon and leads of input-and-output terminals and so forth, which are supported by an outer frame of a lead frame, and by removing such sealed electronic component with mold materials from the outer frame of the lead frame. The lead frame includes suspending pins for supporting the leads and a first mold holder disconnected from the leads. The method includes the steps of resin-molding a first mold member on the leads and the first mold holder to join the leads and the first mold holder with the first mold member, cutting off the suspending pins between the first mold member and the outer frame, resin-molding a second mold member on the first mold member to cover the cut ends of the suspending pins, cutting the first mold member or the first and second mold members to separate the first mold holder from the first mold member and cover other leads than the input-and-output terminals to remove thus molded electronic component from the lead frame. Since the first mold holder is separated from the electronic component by cutting the first mold member (or the first and the second mold member), the first mold holder does not remain in the electronic component nor appear on a surface of the electronic component though it appears on a surface of the component of the method according to the first aspect of this invention.

An electronic component according to this invention employs a double molded construction in which an electric conductive member made from a lead frame and mounted by an electronic component element are molded in a sealing mode so that the electric conductive member electrically connected with the electronic component element, other than input-and-output terminals, is not exposed on a surface of the seal mold member.

Since any electric conductive member (leads and suspending pins) other than the input-and-output conductive member is not exposed on a surface of the seal mold member in the electronic component according to this invention, no surge current or static electricity can flow into the electronic element mounted on the electric conductive member and the exposed electric conductive member does not provide any electrification.

According to a method according to this invention, a second mold member can be molded with resin while leads carrying a first mold member remain to be supported on an outer lead frame. Accordingly, positioning leads on a second molding can be made with precision and ease, so that the electronic components having a double mold construction in a continuous process according to this invention can be made with effective mass productivity. Moreover, since the leads are supported by a first mold holder through a first mold member, the leads are free from being bent or deformed by molding pressure or weight of the electronic component element on second molding as the suspending pins are cut to prevent the suspending pins from being exposed on a surface of the electronic component after first molding, whereby the ratio of perfect products is improved.

BRIEF DESCRIPTION OF THE DRAWINGS

Other objectives and advantages of this invention will be more readily apparent from the following detailed description provided in conjunction with the following figures, of which.

DETAILED DESCRIPTION OF THE INVENTION

Figure 1:
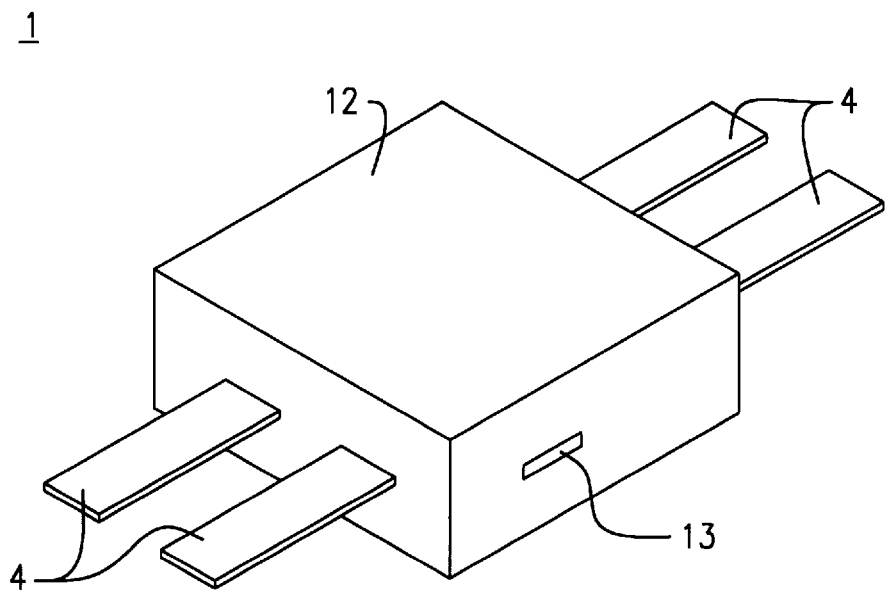
FIG. 1 is a perspective external view of an electronic component as a first embodiment of this invention.

Referring, now, to FIG. 1, there is shown a perspective external view of an electronic component 1 as a first embodiment according to this invention. As described later, an electronic component element 2, such as a semiconductor chip or the like, die-bonded on a die pad 5 and four input-and-output terminals 4 are wire-bonded by gold wires 6, the electronic component element 2 is double-molded with a sealing resin, and the four terminals 4 connected with the element 2 are extended to the external surface of component 1. On a part of a side wall of an outer sealing resin member 12 there is exposed a cut end 13 of a resin holding pin 8a.

Figure 2A:
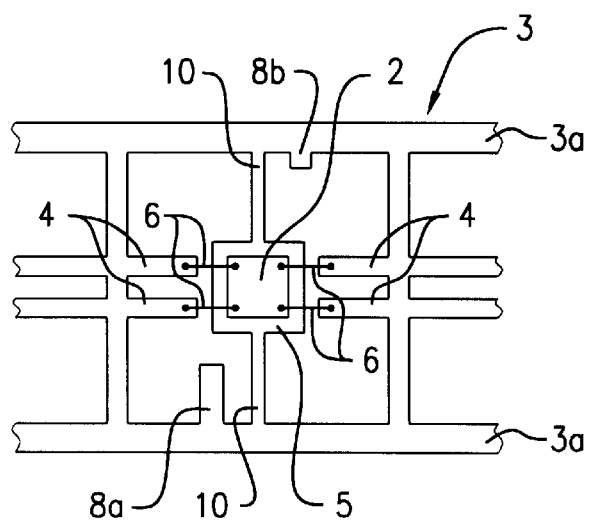
FIGS. 2(a) to (c) illustrate a method for manufacturing the electronic component of FIG. 1.
Figure 2B:
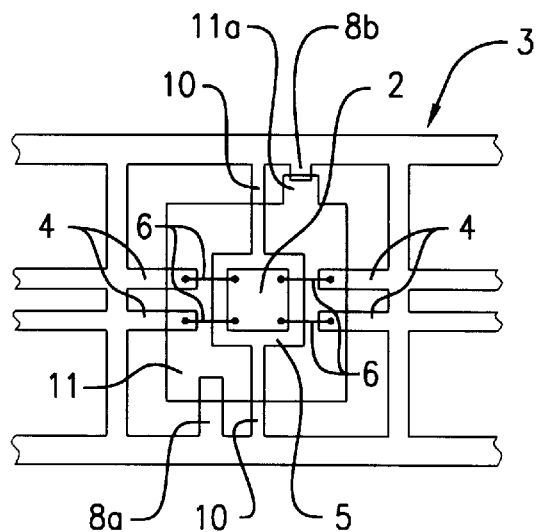
Figure 2C:
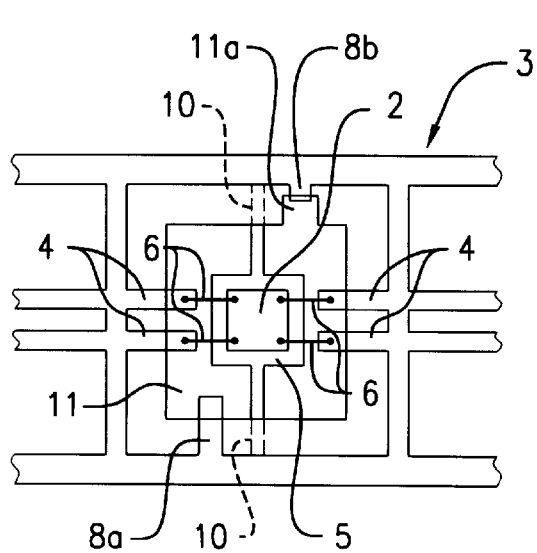
Figure 3D:
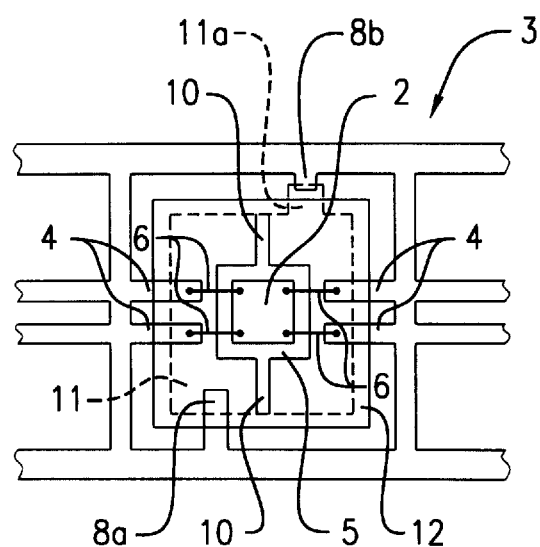
FIGS. 3(d) and (e) illustrate a subsequent method to those of FIGS. 2.
Figure 3E:
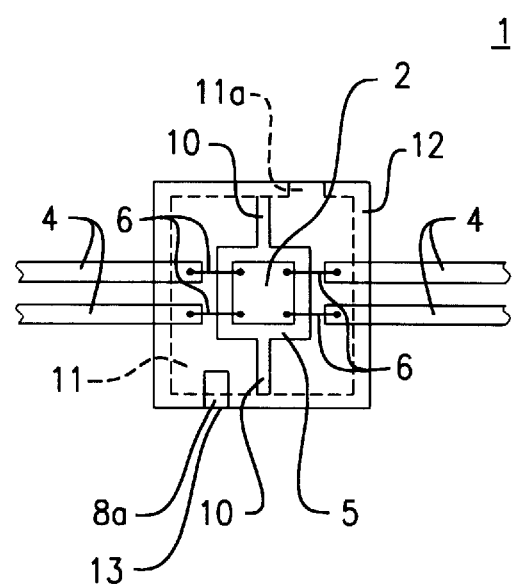

The electronic component 1 can be made as exemplary shown in FIGS. 2 and 3. A lead frame 3 is worked into a pattern, which includes a die pad 5 mounted by electronic component element 2, suspending pins 10 for supporting die pad 5 on an outer frame 3a from either sides, four input-and-output terminals 4, and a pair of long and short resin supporting pins 8a and 8b for supporting an internal sealing resin member 11. The pins 8a and 8b at one ends thereof are connected with the outer frame 3a but at other ends thereof are free so that they can be in the last process electrically insulated from the electronic component element 2 electrically connected with die pad 5 and leads 4. By employing lead frame 3, electronic component element 2 is die-bonded on die pad 5, and element 2 and four leads 4 for input-and-output terminals are wire-bonded by gold wires 6 as shown in FIG. 2(a). As shown in FIG. 2(b) (hidden portions with internal sealing resin member 11 are shown in solid lines for illustration. This is portrayed in FIG. 2(c) as well), the element 2 is seal-molded with resin by injection molding to provide the internal sealing resin member 11. Then, a top end of long resin support pin 8a is buried within the internal sealing resin member 11 and a resin projection 11a is formed in the resin member 11 to be buried by a top end of short resin support pin 8b. Next, an exposed portion (shown in dotted lines) of suspending pins 10 from the internal sealing resin member 11 is cut off from lead frame 3 of FIG. 2(c). After cutting the suspending pins 10, the resin member 11 is supported by outer lead frame 3a through the pair of resin support pins 8a and 8b. An outer sealing resin member 12 is molded by injection molding with the same resin as that of the internal resin member 11 to cover the internal sealing resin member 11 and seal the cut ends (cut surface) of the suspending pins 10 within the outer sealing resin member 12. In FIGS. 3(d) and (e), hidden portions within the outer sealing resin member 12 are shown in solid lines. Finally four leads 4 for input-and-output terminals are cut off from the outer lead frame 3a, and long resin support pin 8a projecting from the outer resin member 12 and resin projection 11a are cut off to make electronic component 1 as shown in FIG. 3(e).

In thus made electronic component 1, electric conductive members such as suspending pins 10 electrically connected with electronic component element 2 are sealed by outer sealing resin member 12 except leads 4 for input-and-output terminals, and externally exposed resin support pin 8a is not electrically connected with element 2, whereby any surge current or static electricity cannot be applied to the internal electronic element 2 to avoid damage to element 2. Any leak current cannot be generated on a surface of component 1, whereby electrification by touching component 1 is avoided.

Outer sealing resin member 12 made by fine resin mold of injection molding makes electronic component 1 fine, high pressure resistance and good hermetic sealing. According to this embodiment, after molding internal sealing resin member 11, the outer resin member 12 can be made in a continuous process without removing the electronic component 1 from lead frame 3, whereby the manufacturing process is simplified to easily manufacture electronic component 1 having a double mold construction.

Figure 4:
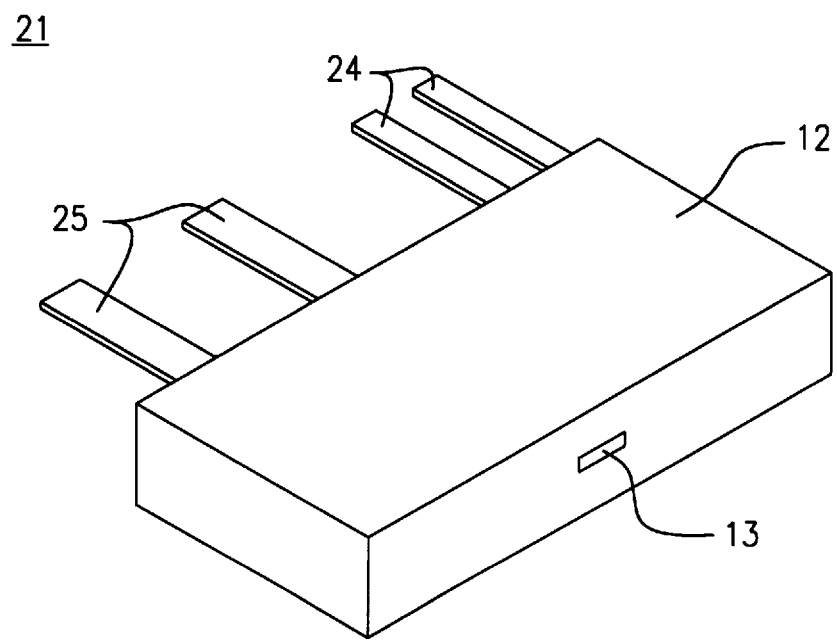
FIG. 4 is a perspective external view of an electronic component as a second embodiment of this invention.

FIG. 4 shows a perspective view of an electronic component 21 as a second embodiment of this invention, which is a solid state relay employing a flat type photocoupler. The electronic component 31 is made by mounting on lead frame 3 photocoupler 22 consisting of a light emitting element 22a and a light receiving element 22b and a power MOS-FET 23 for switching a secondary a.c. or d.c. circuit in response to an output signal from photocoupler 22 and by further double-molding such mounted components in a sealing mode to make a single unit by outwardly extending a pair of input terminal leads 24 and a pair of output terminal leads 25. As shown in FIG. 5, lead frame 3 is worked into a pattern such that it includes the pair of input terminal leads 24, the pair of output terminal leads 25, die pad 5 to be mounted by light receiving element 22b such as a photo array diode and MOS-FET 23, suspending pins 10 for supporting leads 24 and 25 and die pad 5, and long and short resin support pins 8a and 8b for supporting internal sealing resin member 11.

Figure 5A:
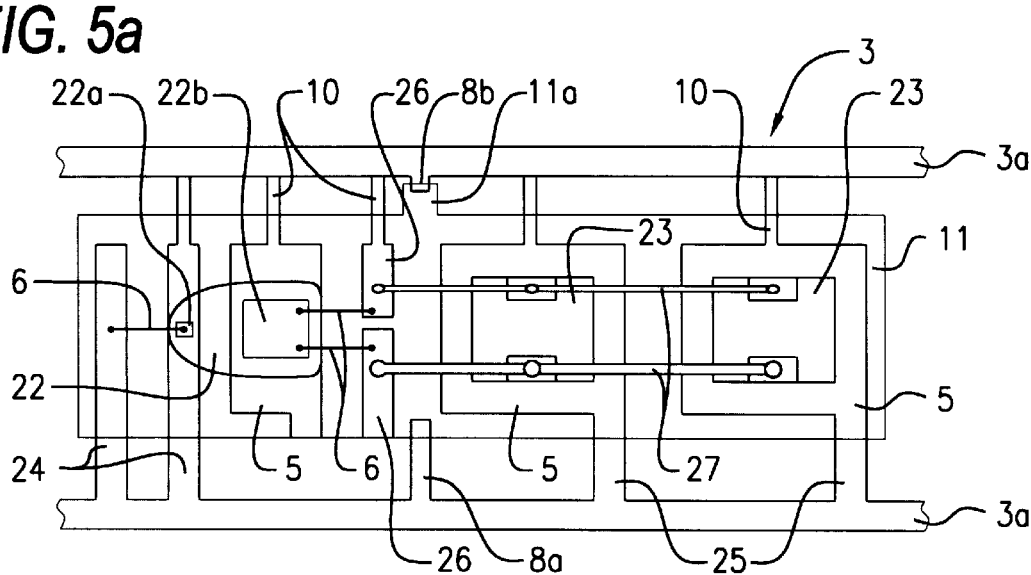
FIGS. 5(a) to (c) illustrate a method for manufacturing the electronic component of FIG. 4.
Figure 5B:
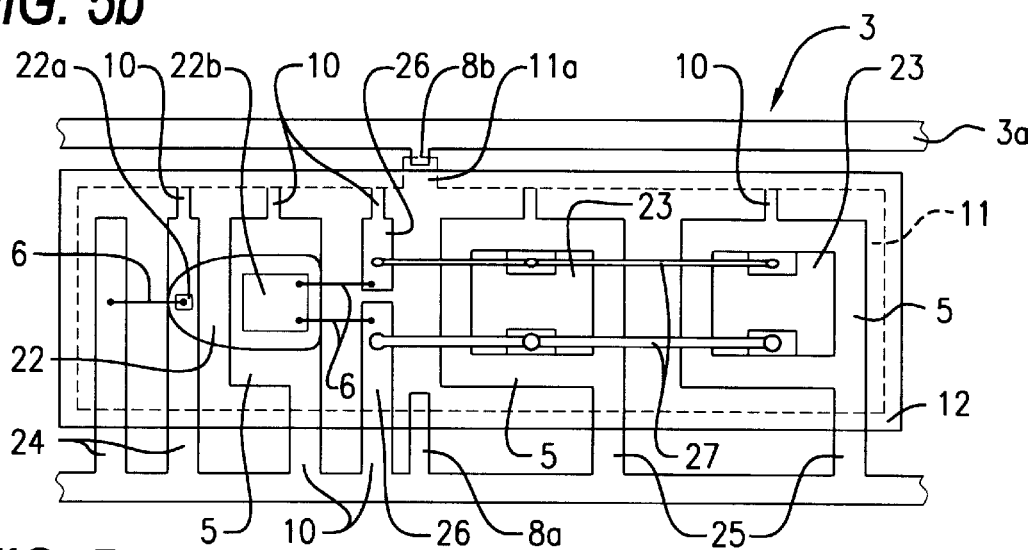
Figure 5C:
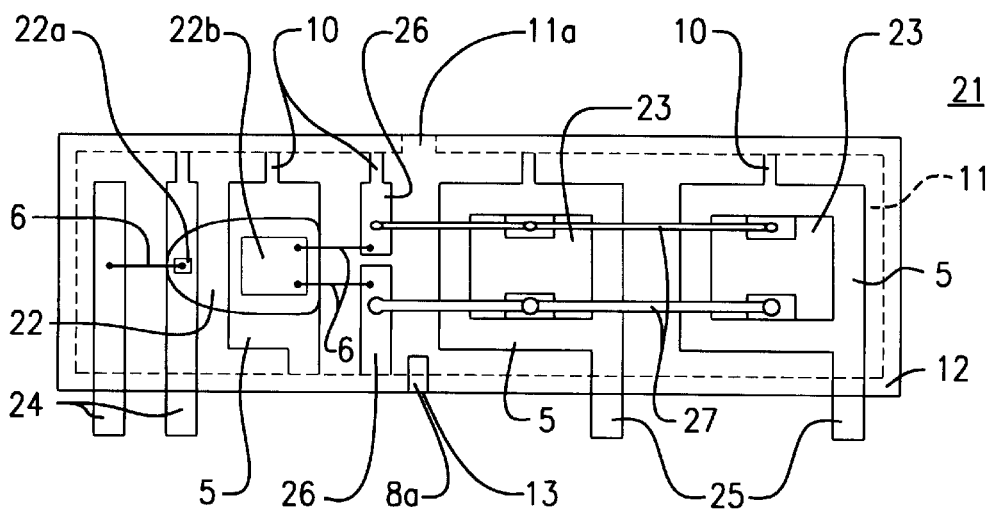
Figure 6:
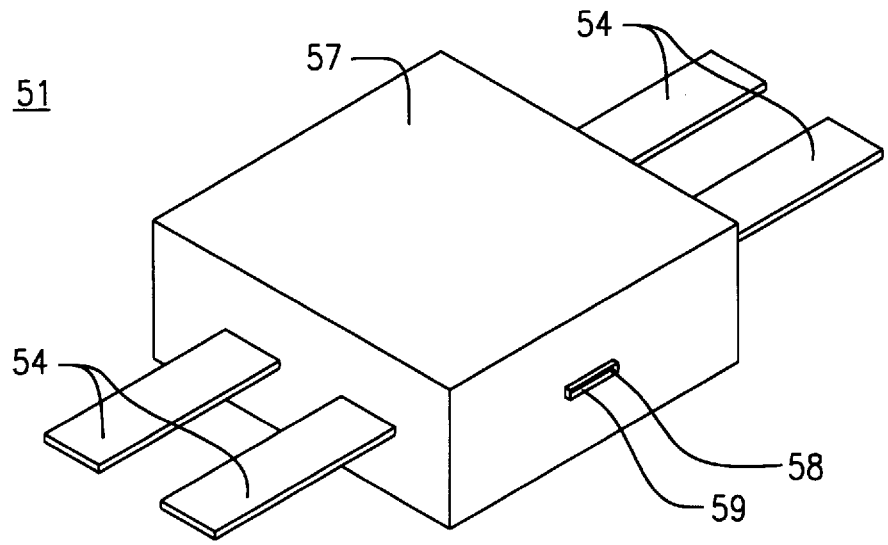
FIG. 6 is a perspective view of a conventional electronic component.
Figure 7:
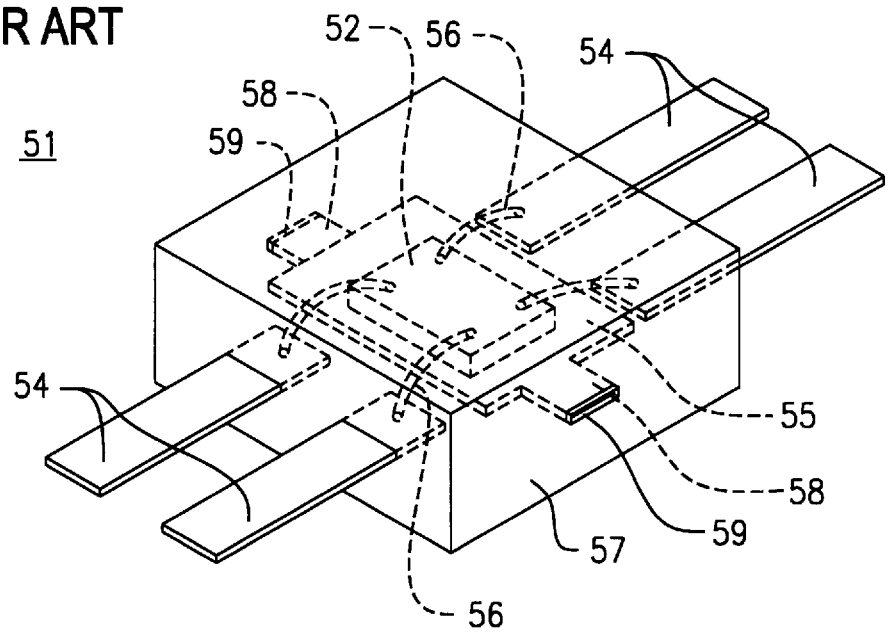
FIG. 7 is a perspective view showing an internal construction of the conventional component of FIG. 6.
Figure 8A:
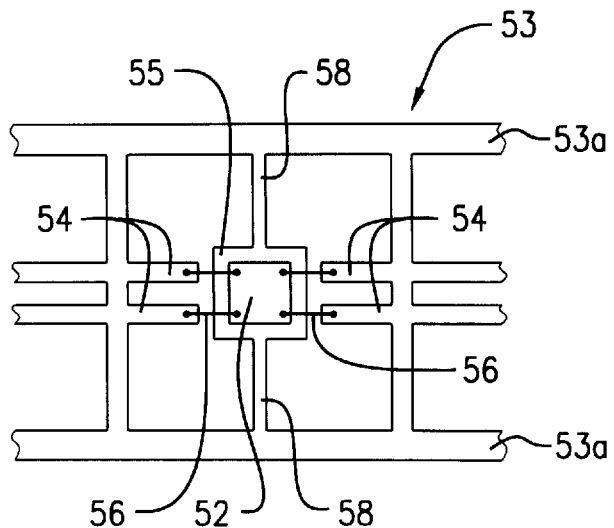
FIGS. 8(a) to (c) illustrate a method for manufacturing the conventional electronic component.
Figure 8B:
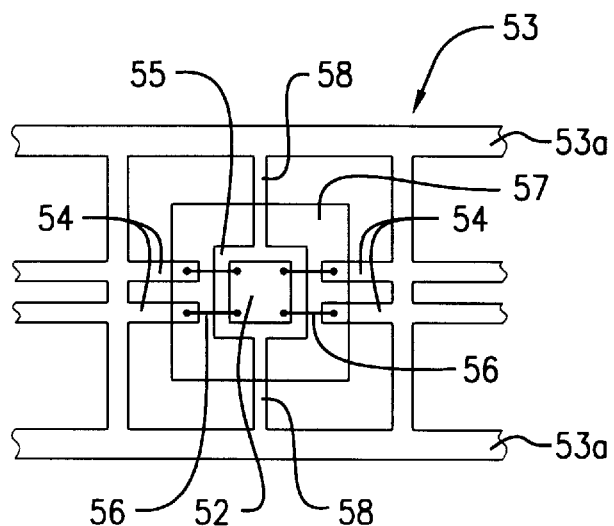
Figure 8C:
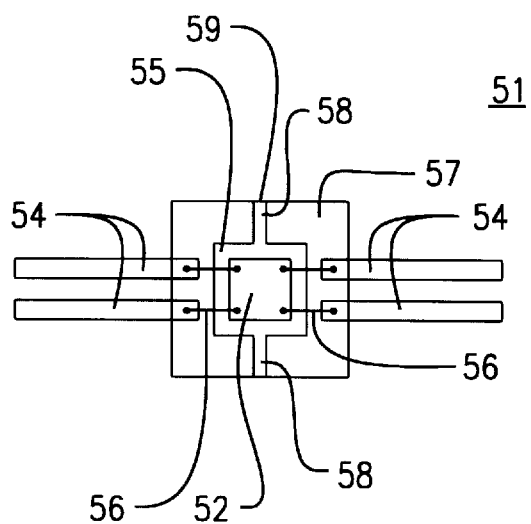

The electronic component 21 is manufactured in a process as shown in FIGS. 5(a) to (c). As shown in FIG. 5(a), the light emitting element 22a of the photocoupler is mounted on one of input terminal leads 24, and the light receiving element 22b is die-bonded on die pad 5 in parallel with light emitting element 22*a*. MOS-FETs 23 are also respectively die-bonded onto other die pads 5. The light emitting element 22*a* is wire-bonded with another input terminal lead 24 by gold wire 6. The light receiving element 22*b* is wire-bonded with relay leads 26 by a pair of gold wires 6, and aluminum wires 27 are connected from relay terminal leads 24 to MOS-FETs 23. Transparent silicone gel is dropped on the light elements 22*a* and 22*b* to make photocoupler 22. Internal sealing resin mold 11 is formed as a single unit to house top ends of resin support pins 8*a* and 8*b*, photocoupler 22 and two MOS-FETs 23. The internal sealing mold member 11 is provided with a resin projection 11*a* to be buried by the top end of short resin support pin 8*b*. As shown in FIG. 5(*b*), a portion of suspending pins 10, supporting die pad 5, input-and-output and terminals leads 25, exposed from the resin member 11 are cut off, and outer sealing resin member 12 is molded from the same resin material as well to cover internal resin member 11. Finally, as shown in FIG. 5(*c*), terminal leads 24 and 25 are cut out from lead frame 3, an exposed portion from the outer sealing resin member 13 about the resin support pin 8*a* is cut out, and resin projection 11*a* is cut off to separate resin support pin 8*b* to complete electronic component 21.

This component 21 is used for switching a load, so that the die pads 5 mounted by MOS-FETs 23 are applied with a high voltage, such as a.c. 100 v or 200 V. Accordingly, though electrification happens in a conventional electronic component by touching an exposed cut end of an suspending pin, the cut end of suspending pin 10 of the electronic component 21 of this embodiment is covered by the outer resin member 12 to avoid any electrification by erroneous touch and thus ensures safety. The light receiving element 22*b* and power MOS-FETs 23 are free from any external surge current and damage.

In the process for molding outer resin member 12, internal resin member 11 is supported by resin support pins 8*a* and 8*b* so that outer resin member 12 can be made without bending input and output terminal leads 24 and 25 by slant of internal resin mold member 11 by mold pressure and so forth after suspending pins 10 are cut off. This is very efficient on the electronic component for extending input and output terminal leads 24 or 25 as described in this embodiment.

In the respective above-mentioned embodiments, there is provided a construction in which resin support lead 8*a* projecting from lead frame 3 is buried within internal resin member 11 and resin support lead 8*a* is cut off to remove the electronic component 1 or 21 from lead frame 3, and another construction in which resin projection 11*a* disposed on internal resin member 11 catches top end of resin support pin 8*b* and resin projection 11*a* is cut off to remove the electronic component 1 or 21 from lead frame. If desired, however, only one of the constructions may be employed. If only the construction for cutting resin support lead 8 buried by internal resin member 11 is employed, metal molds for molding internal resin member 11 and outer resin member 12 can be simplified. If only the construction for cutting resin projection 11*a* catching resin support lead 8*b* is employed, metal portion other than input and output terminal leads can be covered without being exposed on outer resin member 12 while providing improved ornament.

If desired, the electronic component element may be mounted on the die pad after the die pads and resin support lead are connected with resine with the internal resin member as a primary molding, and the die pads may be sealed by the outer resin member as a second molding. However, the internal mold member first molded after mounting the electronic component on the die pads as embodied in the foregoing embodiments does not interrupt mounting of the electronic component element by resin adhesion on first molding, and improves the production ratio of perfect components. The die pads need not necessarily be sealed by internal or outer resin members alone, but may be sealed by engagement of internal and outer resin members.

While the invention has been described and illustrated with respect to certain embodiments which give satisfactory results, it will be understood by those skilled in the art, after understanding the purpose of the invention, that various other changes and modifications may be made without departing from the spirit and scope of the invention, and it is therefore, intended in the appended claims to cover all such changes and modifications.

What is claimed is:

1. An electronic component comprising an electronic component element, a connection terminal electrically connected with said electronic component element for connection with an external component, a first conductive support member for supporting said electronic component element, a second conductive support member substantially in a same plane as said first conductive support member, a first insulating member for covering a surface of said electronic component element, said connection terminal, said first conductive support member and said second conductive support member, said second conductive support member being insulated from said electronic component element and said first conductive support member, and supporting said first insulating member, and a second insulating member for covering an exposed surface of said first conductive support member.

2. An electronic component according to claim 1, wherein said second conductive support member is exposed.

3. An electronic component comprising an electronic component element, a connection terminal electrically connected with said electronic component element for connection with an external component, a conductive support member for supporting said electronic component element, a first insulating member for covering a surface of said electronic component element, said connection terminal, and said conductive support member, a projection element of said first insulating member for supporting said first insulating member, and a second insulating member for covering an exposed surface of said conductive support member.

* * * * *